United States Patent
Choi

(10) Patent No.: US 8,723,529 B2
(45) Date of Patent: May 13, 2014

(54) SEMICONDUCTOR DEVICE, TEST METHOD, AND TEST APPARATUS

(75) Inventor: Young-Don Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 419 days.

(21) Appl. No.: 13/270,383

(22) Filed: Oct. 11, 2011

(65) Prior Publication Data

US 2012/0161780 A1    Jun. 28, 2012

(30) Foreign Application Priority Data

Dec. 27, 2010    (KR) .................. 10-2010-0135598

(51) Int. Cl.
*G01R 31/02* (2006.01)
*G01R 31/26* (2014.01)

(52) U.S. Cl.
USPC ............. 324/537; 324/762.05; 324/762.06; 324/763.01; 327/538; 327/541

(58) Field of Classification Search
CPC ......... G01R 31/02; G01R 31/26; G01R 31/40
USPC ........................................ 324/537–763.02
See application file for complete search history.

(56) References Cited

U.S. PATENT DOCUMENTS

| | | | | |
|---|---|---|---|---|
| 7,723,999 | B2* | 5/2010 | Strid et al. | 324/601 |
| 8,368,247 | B2* | 2/2013 | Colombo | 307/43 |
| 2002/0053943 | A1* | 5/2002 | Yamasaki et al. | 327/538 |
| 2008/0068086 | A1* | 3/2008 | Tsurumaki et al. | 330/277 |

FOREIGN PATENT DOCUMENTS

| | | |
|---|---|---|
| JP | 2010-223727 | 10/2010 |
| KR | 100532447 | 11/2005 |
| KR | 1020100090076 A | 8/2010 |

* cited by examiner

*Primary Examiner* — Melissa Koval
*Assistant Examiner* — Emily Chan
(74) *Attorney, Agent, or Firm* — Voletine & Whitt, PLLC

(57) ABSTRACT

A semiconductor device includes; a first pad that receives an external voltage during a test, a second pad coupled to an external impedance during the test, a voltage-current converter coupled to the first pad and the second pad and generating a bias current substantially in response to only the external voltage and the external impedance, and an internal circuit responsive to a test current during the test, such that the level of the test current is defined by the level of the bias current.

13 Claims, 8 Drawing Sheets

SEMICONDUCTOR DEVICE, TEST METHOD, AND TEST APPARATUS

This application claims priority from Korean Patent Application No. 10-2010-0135598 filed on Dec. 27, 2010, the subject matter of which is hereby incorporated by reference.

BACKGROUND OF THE INVENTION

The present inventive concept relates to semiconductor devices, methods of testing semiconductor devices, and associated test apparatuses.

During testing various constituent circuits and elements of a semiconductor device will be evaluated in response to one or more test signals. Such test signals are generally provide by an external source (e.g., a controller, tester, or connected test equipment). A test signal may be voltage or a current. A test voltage may be simultaneously applied in parallel to a plurality of semiconductor devices. However, a test current must usually be applied to semiconductor devices in a point-to-point manner. That is, the test current must be individually applied to respective semiconductor devices. This limitation results in lengthy test times and/or very costly test equipment setups. Given the vast number of semiconductor devices that must effectively tested before commercial shipment, manufacturers seek to reduce per device test times to an absolute minimum, consistent with test reliability.

SUMMARY OF THE INVENTION

Embodiments of the inventive concept provide semiconductor devices that may be collectively tested in parallel using a test current.

In one embodiment, the inventive concept provides a semiconductor device comprising; a first pad that receives an external voltage during a test, a second pad coupled to an external impedance during the test, a voltage-current converter coupled to the first pad and the second pad and configured to generate a bias current substantially in response to only the external voltage and the external impedance, and an internal circuit responsive to a test current during the test, wherein a level of the test current is defined by a level of the bias current.

In another embodiment, the inventive concept provides a semiconductor device comprising; a first pad that receives an external voltage during a test, a second pad that is coupled to an external impedance during the test, a voltage-current converter coupled to the first pad and the second pad and configured to generate a bias current substantially in response to only the external voltage and the external impedance, and an internal circuit responsive to a test current during the test, wherein a level of the test current is defined by a level of the bias current, wherein the voltage-current converter comprises; a driving transistor coupled between ground and the second pad and configured to generate the bias current in response to a bias voltage, and a comparator having inputs respectively coupled to the first pad and the second pad, having an output coupled to the gate of the driving transistor, and configured to generate the bias voltage at the output by comparing the external voltage with a reference voltage apparent at the second pad.

In another embodiment, the inventive concept provides a method of testing semiconductor devices. The method comprises; arranging a plurality of semiconductor devices for a test designed to apply a test current to an internal circuit of each one of the plurality of semiconductor devices, wherein each one of the plurality of semiconductor devices includes a first pad, a second pad, and a voltage-current converter coupled to the first pad and the second pad, applying an external voltage to the first pads of the plurality of semiconductor devices, coupling an external impedance to the second pads of the plurality of semiconductor devices, and generating a bias current substantially in response to only the external voltage and the external impedance within the voltage-current converter of each one of the plurality of semiconductor devices, wherein a level of the test current is defined by the bias current.

BRIEF DESCRIPTION OF THE DRAWINGS

The above and other aspects and features of the present inventive concept will become more apparent upon consideration of a more detailed description of certain exemplary embodiments with reference to the attached drawings, in which.

DETAILED DESCRIPTION

Advantages and features of the present inventive concept and methods of accomplishing the same will be more readily understood upon consideration of the following exemplary embodiments with reference to the accompanying drawings. The present inventive concept may, however, be embodied in many different forms and should not be construed as being limited to only the illustrated embodiments. Rather, these embodiments are provided so that this disclosure will be thorough and complete and will fully convey the concept of the inventive concept to those skilled in the art, and the present inventive concept will only be defined by the appended claims. Throughout the written description and drawings, like reference numbers and labels are used to denote like or similar elements.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
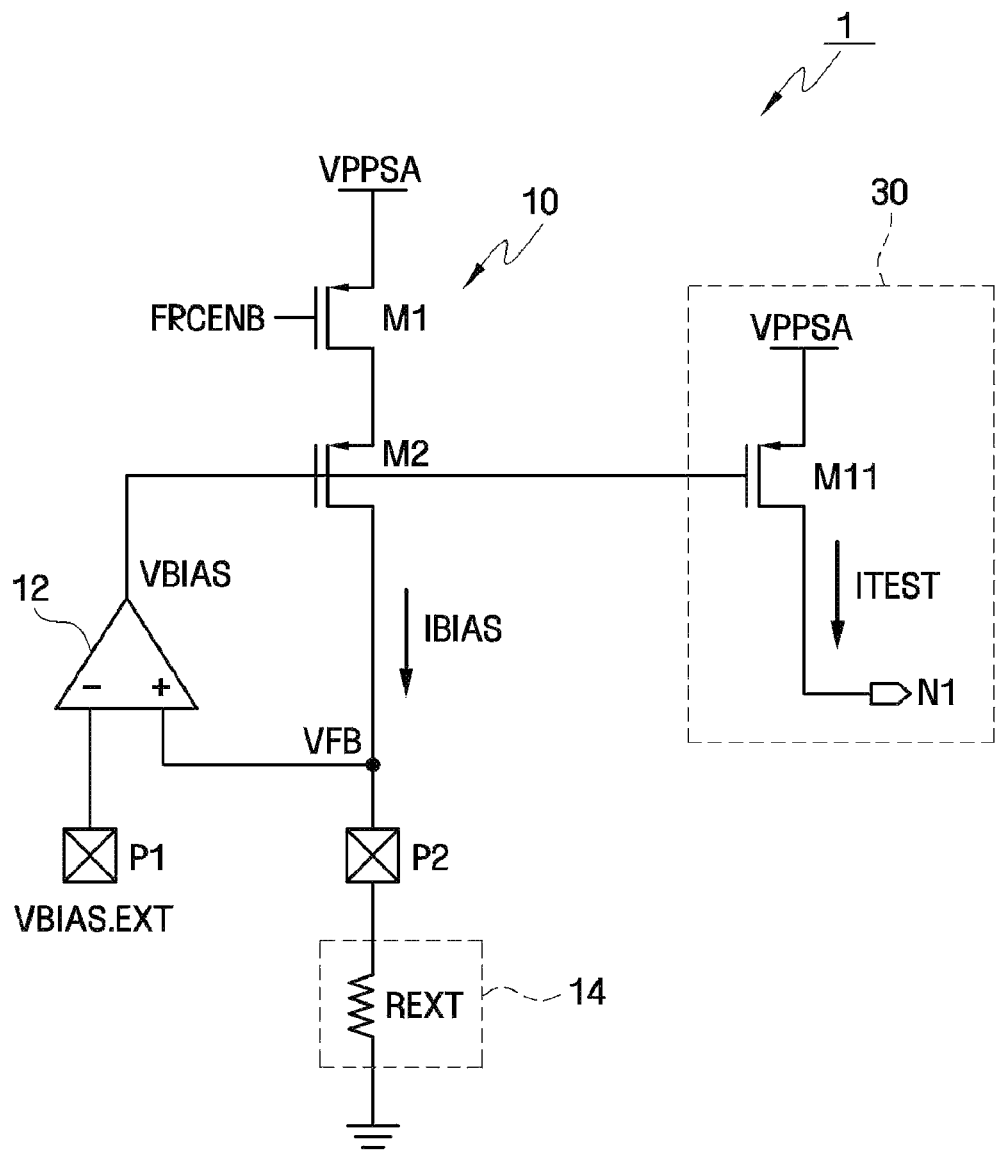
FIG. 1 is a circuit diagram of a semiconductor device according to an embodiment of the inventive concept.

FIG. 1 is a circuit diagram of a semiconductor device 1 according to an embodiment of the inventive concept. The semiconductor device 1 comprises a first pad P1, a second pad P2, a voltage-current converter 10, and an internal circuit 30.

Those skilled in the art will understand that the term "pad" denotes a range of physical structures adapted within a semiconductor device to receive or transmits an electrical signal (i.e., a voltage and/or current). Many different structures may be used as a pad depending on the nature of the semiconductor device being tested. In the example of FIG. 1, the first pad P1 is configured to receive an external voltage VBIAS.EXT during a test operation. The second pad P2 is coupled to an external impedance 14 during the test operation. The external impedance 14 may be, but is not limited to, a resistor REXT. Thus, the external impedance 14 is coupled between ground and the second pad P2 during the test operation.

Within the context of the inventive concept the "external" impedance 14 may not physically disposed within the semiconductor device 1, but must nonetheless be coupled to the second pad P2 only during the test operation. For example, the external impedance 14 may be coupled to the second pad P2 via a probe tip applied to the second pad P2 by an external test apparatus during the test operation. However, the inventive concept is not limited thereto.

The voltage-current converter 10 is coupled to the first pad P1 and the second pad P2, and is configured to generate a bias current IBIAS and a bias voltage VBIAS in response to the external voltage VBIAS.EXT and the external impedance 14. In the specific example of FIG. 1, the voltage-current converter 10 comprises a first select transistor M1, a driving transistor M2, and a comparator 12.

The first select transistor M1 and the driving transistor M2 are serially connected between a first voltage VPPSA and the second pad P2. Here, the first voltage VPPSA may be, but is not limited to, a step-up voltage used by a sense amplifier within the semiconductor device 1.

The first select transistor M1 may be selectively turned ON/OFF by a first select signal FRCENB applied to the gate thereof. In certain embodiments, the first select transistor M1 may be, but is not limited to, a p-channel metal oxide semiconductor (PMOS) transistor.

The driving transistor M2 may be configured to generate the bias current IBIAS when the bias voltage VBIAS—as provided by the comparator 12—is applied to the gate of the driving transistor M2.

In the example of FIG. 1, a first (negative) input terminal of the comparator 12 is coupled to the first pad P1, a second (positive) input terminal of the comparator 12 is coupled to the second pad P2, and the output of the comparator 12 is provided to the gate of the driving transistor M2. With this configuration, the comparator 12 compares the external voltage VBIAS.EXT applied to the first pad P1 with a reference voltage VFB apparent at the second pad P2 and outputs a corresponding bias voltage VBIAS as the comparison result.

As shown in FIG. 1, the first select transistor M1 and the driving transistor M2 may be, but are not limited to, PMOS transistors. In addition, the comparator 12 may be, but is not limited to, an operation amplifier.

The internal circuit 30 receives the bias voltage VBIAS from the voltage-current converter 10 and generates a test current ITEST. The internal circuit 30 may perform various test operations (e.g., a read operation, a write operation, a burning operation, etc.) using the test current ITEST. In the example of FIG. 1, the internal circuit 30 comprises, but is not limited to, a PMOS transistor M11 coupled between the first voltage VPPSA and a node N1. The level of the test current ITEST may be, but not necessarily, equal to that of the bias current IBIAS.

With the foregoing configuration, the semiconductor device 1 may operate during a test operation as follows. First, the external voltage VBIAS.EXT is applied to the first pad P1, and the grounded external impedance 14 is coupled to the second pad P2. Then, the comparator 12 provides the bias voltage VBIAS to the driving transistor M2, and the driving transistor M2 provides the bias current IBIAS in response to the bias voltage VBIAS (e.g., in response to the level or magnitude of the bias voltage). In turn, the level of the bias current IBAIS determines the reference voltage VFB apparent at the second pad P2.

Thus, through this feedback process, the external voltage VBIAS.EXT becomes equal to the reference voltage VFB apparent at the second pad P2, and the bias current IBIAS is defined by the relationship given in Equation 1 below. That is, the bias current IBIAS is determined by the external voltage VBIAS.EXT and the external impedance 14.

$$IBIAS = VBIAS.EXT/REXT \quad (1)$$

Since the bias current IBIAS is generated using only the external voltage VBIAS.EXT and the external impedance 14, the resulting level of the bias current IBIAS is significantly insensitive to the process-voltage-temperature (PVT) variations that always effect the electrical response of elements and circuits within the semiconductor device 1. In particular, the external impedance 14 may be externally provided using a high precision resistor (or resistance element) having a very low margin of ohmic variation (e.g., in the order of 0.1% or less). In addition, the external voltage VBIAS.EXT may be precisely defined by an external source, and remain significantly unaffected by PVT variations.

To reiterate, the external impedance 14 is not provided by (disposed or installed within) the semiconductor device 1. Therefore, whenever necessary, the external impedance 14 may be readily replaced with another impedance of desired characteristics (e.g., size, resistance, degree of precision, etc.). In addition, the external impedance 14 may be coupled to a pad for other purposes. Therefore, there is no need to form a dedicated test pad.

As illustrated by the foregoing embodiment of the inventive concept, during a test operation, the bias voltage VBIAS and the bias current IBIAS may be generated with a carefully defined level and within strictly controlled tolerances using the external voltage VBIAS.EXT and the external impedance 14. As a result, the internal circuit 30 may be tested in relation to a corresponding test current ITEST that is stable and well defined, since it is a function of the bias voltage VBIAS.

Of further significance, since the test current ITEST may be generated using the external voltage VBIAS.EXT and the external impedance 14 during a test operation, current-related testing may be conducted simultaneously on a significantly number of semiconductor chips (e.g., more than 100 semiconductor chips). This ability greatly improves the efficiency of the current-related testing, and testing time for a batch of semiconductor devices may be drastically reduced.

Figure 2:
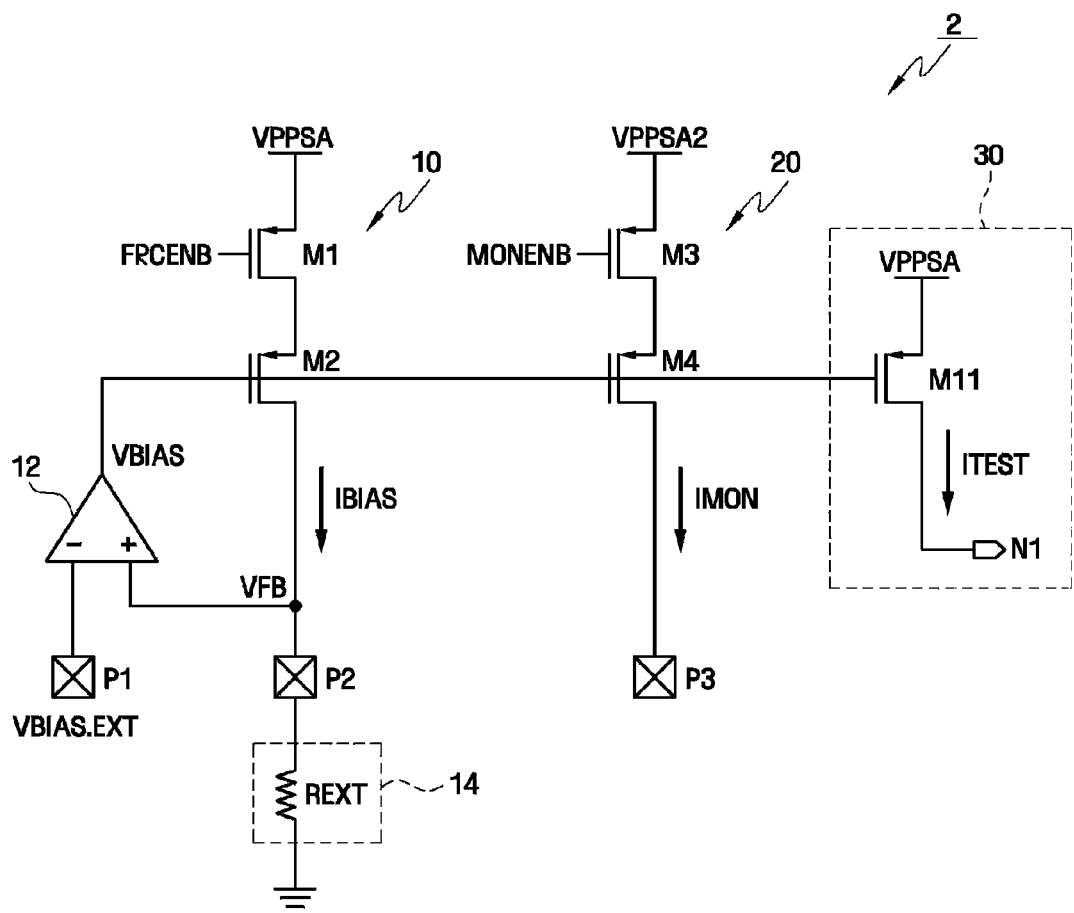
FIG. 2 is a circuit diagram of a semiconductor device according to another embodiment of the inventive concept.

FIG. 2 is a circuit diagram of a semiconductor device 2 according to another embodiment of the inventive concept. The semiconductor device 2 is similar to the semiconductor 1 described in relation to FIG. 1, except a monitoring unit 20 is added between the voltage-current converter 10 and the internal circuit 30.

The monitoring unit 20 may be used to generate a monitoring current IMON that mirrors the bias current IBIAS. This monitoring current IMON may be used to determine whether the bias current IBIAS is being accurately generated according to (e.g.,) a predetermined level. For example, the monitoring current IMON may be applied to an external test apparatus checking the test operation.

In the example shown in FIG. 2, the monitoring unit 20 comprises a second select transistor M3, a monitoring transistor M4, and a third pad P3. The second select transistor M3 and the monitoring transistor M4 are serially connected between a second voltage VPPSA2 and the third pad P3. Here, the second voltage VPPSA2 may be, but need not be, the same as the first voltage VPPSA.

The second select transistor M3 may be selectively turned ON/OFF by a second select signal MONENB applied to its gate. Here again, the second select transistor M3 may be, but is not limited to, a PMOS transistor.

The monitoring transistor M4 generates the monitoring current IMON when a bias voltage VBIAS—as provided by the comparator 12—is applied to a gate of the monitoring transistor M4. The bias voltage VBIAS is commonly applied to a driving voltage M2 of a voltage-current converter 10 and the monitoring transistor M4 of the monitoring unit 20. Thus, the bias current IBIAS and the monitoring current IMON may be substantially the same. Therefore, an external test apparatus, for example, may measure the monitoring current IMON through the third pad P3 (i.e., a monitoring pad) to accurately determine the level of the bias current IBIAS.

Figure 3:
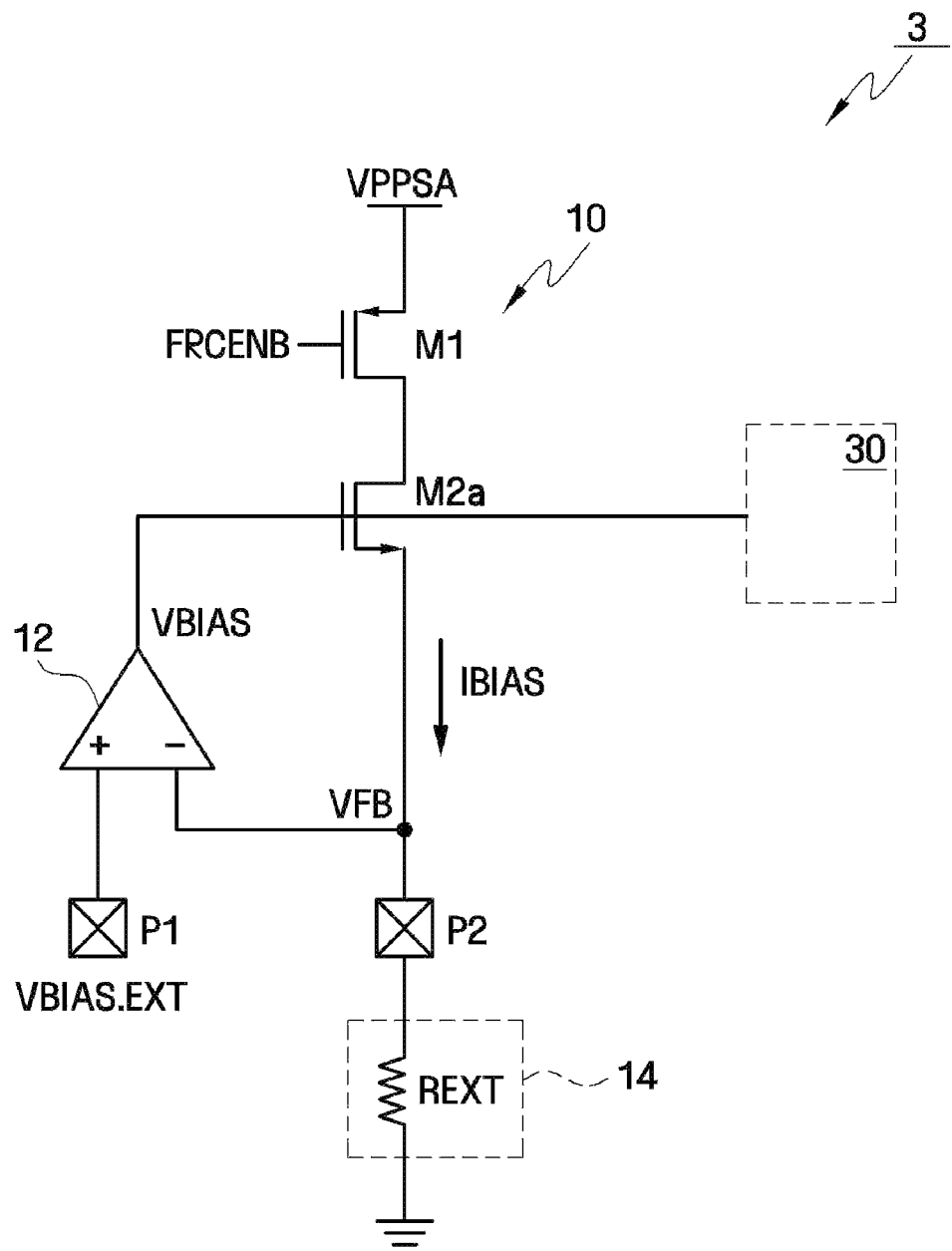
FIG. 3 is a circuit diagram of a semiconductor device according to yet another embodiment of the inventive concept.

FIG. 3 is a circuit diagram of a semiconductor device 3 according to yet another embodiment of the inventive concept. The semiconductor device 3 is substantially similar to the semiconductor device 1 described above in relation to FIG. 1. except an n-channel metal oxide semiconductor (NMOS) transistor is used to implement a driving transistor M2a. Despite this change in constituent component type, the semiconductor device 3 may be operated in the substantially same way as the semiconductor device 1.

Figure 4:
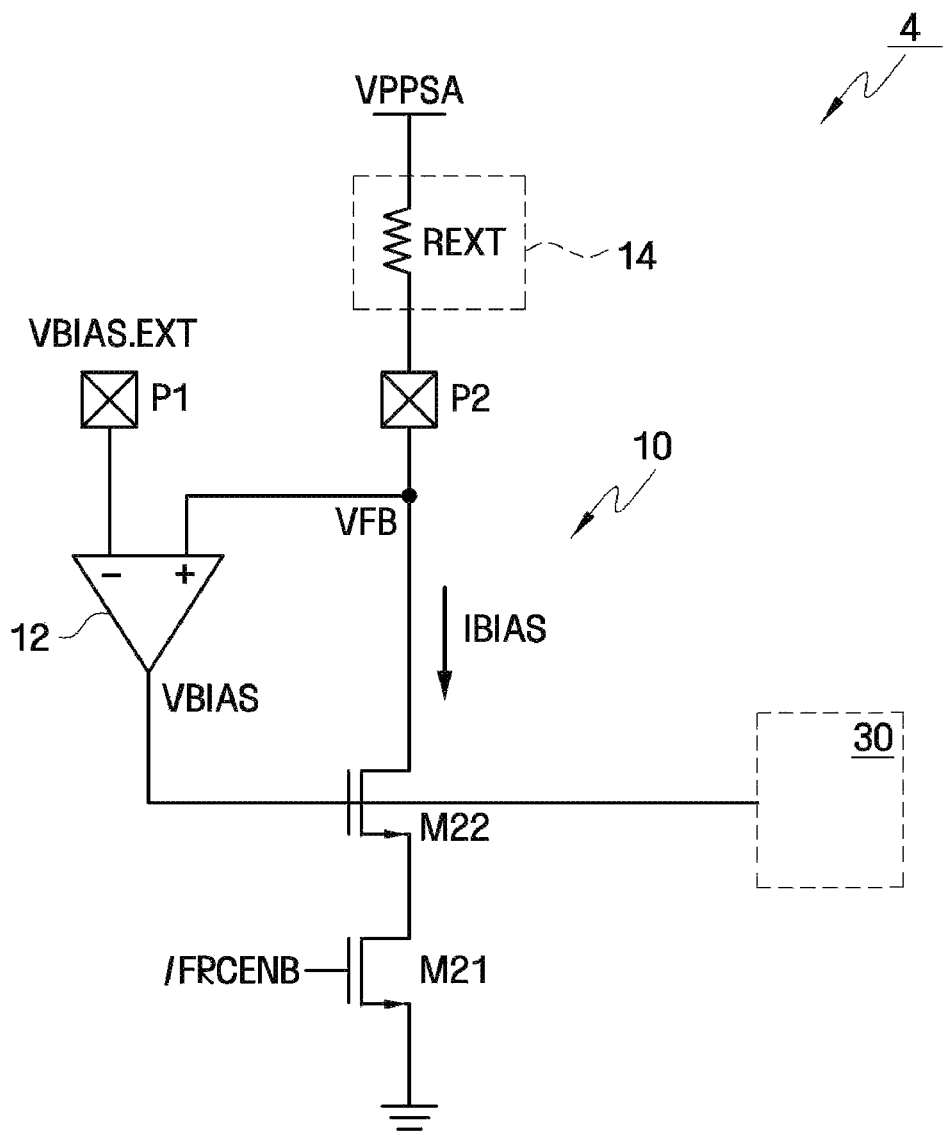
FIG. 4 is a circuit diagram of a semiconductor device according to yet another embodiment of the inventive concept.

FIG. 4 is a circuit diagram of a semiconductor device 4 according to yet another embodiment of the inventive concept. The semiconductor device 4 again comprises a first pad P1, a second pad P2, a voltage-current converter 10, and an internal circuit 30, but these elements are arranged differently with respect to the semiconductor 1 of FIG. 1.

The first pad P1 is provided with an external voltage VBIAS.EXT during a test operation. The second pad P2 is coupled to an external impedance 14 during the test operation. Here, the external impedance 14 is coupled between the second pad P2 and a first voltage VPPSA. The first voltage VPPSA may be, but is not limited to, a step-up voltage used in a sense amplifier of the semiconductor device 4.

A first select transistor M21 and a driving transistor M22 are serially connected between ground and the second pad P2. The first select transistor M21 may be selectively turned ON/OFF by a select signal/FRCENB applied to a gate thereof. The driving transistor M22 generates a bias current IBIAS when a bias voltage VBIAS, which is an output signal of a comparator 12, is applied to a gate of the driving transistor M22. The first select signal M21 and the driving transistor M22 may be, but not limited to, NMOS transistors.

With this configuration, the semiconductor device 4 may be operated during a test operation as follows. First, the external voltage VBIAS.EXT is applied to the first pad P1, and the external impedance 14 is coupled to the second pad P2. Then, the comparator 12 provides the bias voltage VBIAS to the driving transistor M22, and the driving transistor M22 provides the bias current IBIAS according to the level of the bias voltage VBIAS. The level of the bias current IBAIS determines a voltage VFB of the second pad P2. Through this feedback process, the external voltage VBIAS.EXT becomes equal to the voltage VFB of the second pad P2, and the bias current IBIAS has a preset value. That is, the bias current IBIAS is determined by the external voltage VBIAS.EXT and the external impedance 14. The internal circuit 30 generates a test current ITEST using the bias voltage VBIAS.

Figure 5:
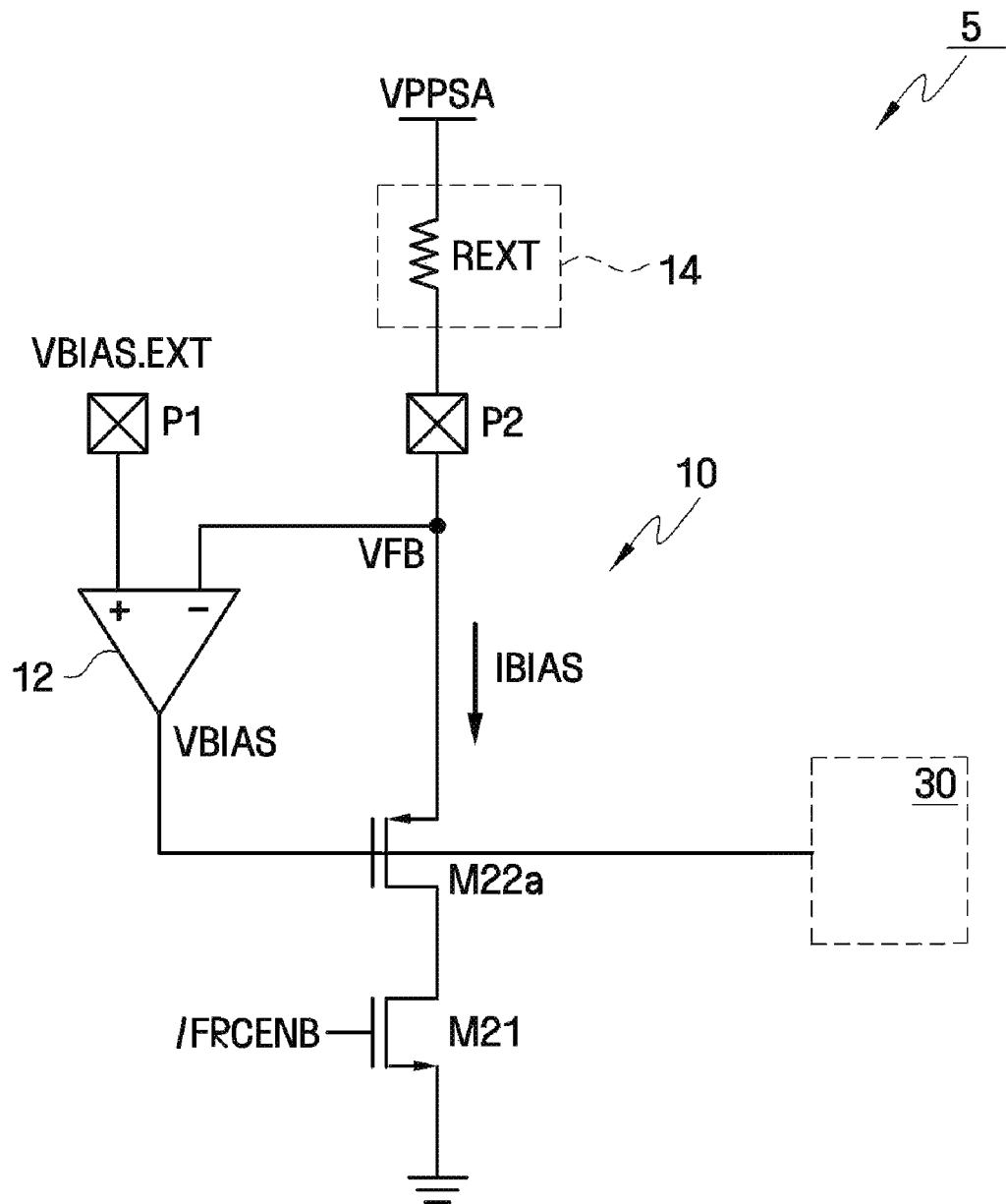
FIG. 5 is a circuit diagram of a semiconductor device according to yet another embodiment of the inventive concept.

FIG. 5 is a circuit diagram of a semiconductor device 5 according to yet another embodiment of the inventive concept. The semiconductor device 5 is substantially similar to that of the semiconductor device 4, except a PMOS transistor is used to implement a driving transistor M22a. Although the semiconductor device 5 is configured with different constituent components, it may be operated in the substantially the same way as the semiconductor device 4.

Figure 6:
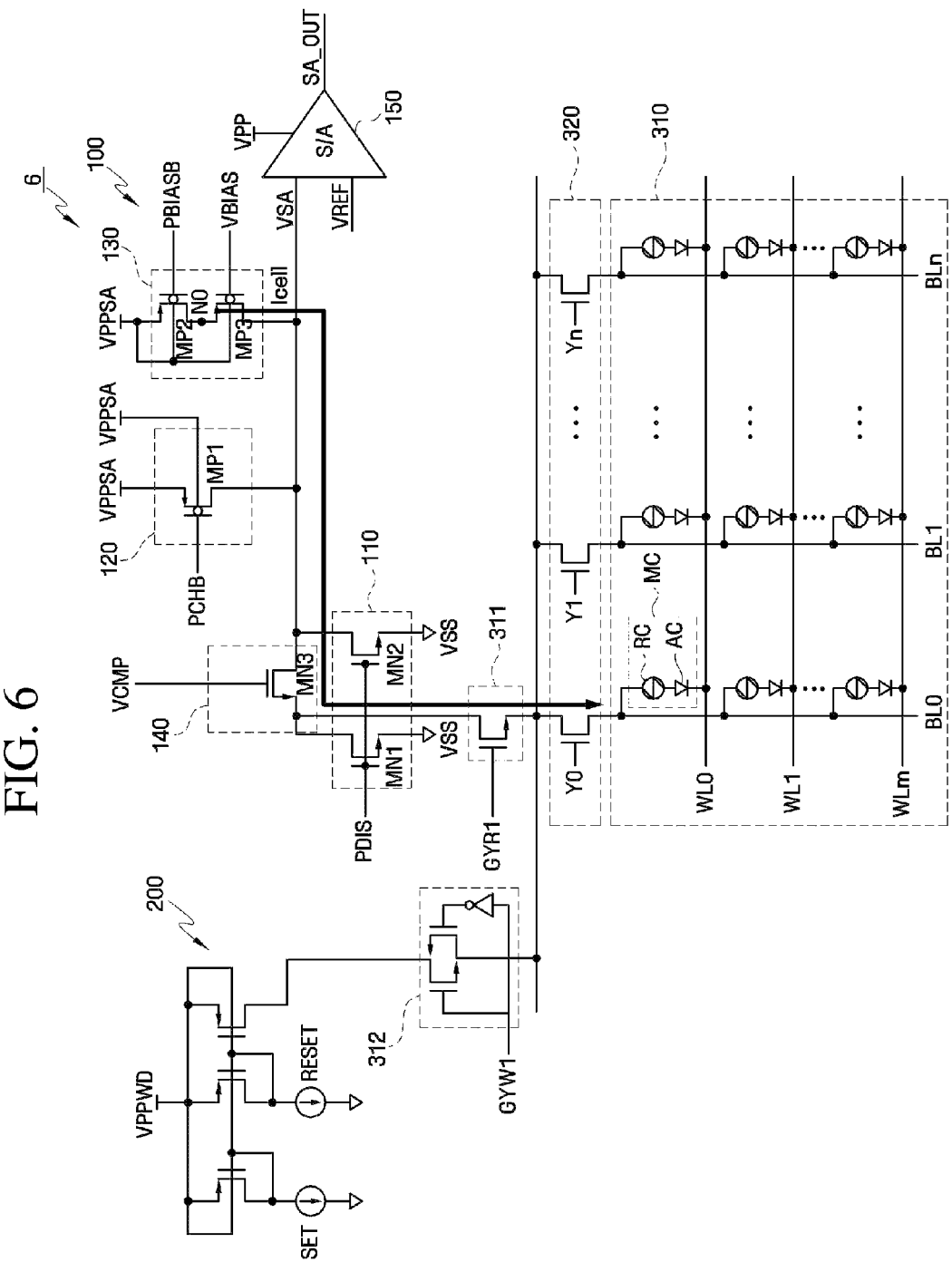
FIG. 6 is a circuit diagram of a semiconductor device according to yet another embodiment of the inventive concept.

FIG. 6 is a circuit diagram, given in relevant portion, of a semiconductor device 6 according to still another embodiment of the inventive concept. A case where a bias voltage VBIAS described above with reference to FIGS. 1 through 5 is used in a read operation test will now be described with reference to FIG. 6. While a case where the bias voltage VBIAS is used in a read circuit 100 is described as an example, the present inventive concept is not limited to this case. For example, the bias voltage VBIAS can also be used in a write circuit 200.

The following example assumes a particular embodiment of the inventive concept as incorporated within a phase-change random access memory (PRAM). However, it will be apparent to those skilled in the art that similar embodiments of the present inventive concept may be incorporated into a range of semiconductor memories, such as resistive RAMs, ferroelectric RAMs, etc.

Referring to FIG. 6, the semiconductor device 6 according to the sixth exemplary embodiment includes a memory cell array 310, global column select circuits 311 and 312, a local column select circuit 320, the read circuit 100, and the write circuit 200.

The memory cell array 310 includes a plurality of resistive memory cells MC arranged in a matrix. The resistive memory cells MC are coupled between a plurality of word lines WL0 through WLm and a plurality of bit lines BL0 through BLn, respectively. Each of the resistive memory cells MC may include a variable resistance element RC and an access element AC. The variable resistance element RC includes a phase-change material having two different resistance values in a crystalline state and an amorphous state. The access element AC controls electric current flowing through the variable resistance element RC. The access element AC may be a diode or a transistor coupled in series to the variable resistance element RC. The access element AC illustrated in FIG. 6 is a diode. In addition, various kinds of materials may be used as the phase-change material. For example, the phase-change material may a combination of two elements such as GaSb, InSb, InSe, $Sb_2Te_3$ or GeTe, a combination of three elements such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. In particular, GeSbTe, which is a combination of germanium (Ge), antimony (Sb) and tellurium (Te), may be typically used as the phase-change material.

The global column select circuits 311 and 312 may include a global read column select circuit 311 coupled to the read circuit 100 and a global write column select circuit 312 coupled to the write circuit 200. The local column select circuit 320 selects some (e.g., the bit line BL0) of the bit lines BL0 through BLn.

The write circuit 200 selectively generates a set current or a reset current to write data to the resistive memory cells MC of the memory cell array 310.

The read circuit 100 reads data stored in the resistive memory cells MC of the memory cell array 310. In the present inventive concept, the read circuit 100 is provided with the bias voltage VBIAS and generates a read current Icell for test purposes. Specifically, the read circuit 100 receives the bias voltage VBIAS and provides the read current Icell for test purposes to a selected resistive memory cell MC to read a resistance level of the selected resistive memory cell MC.

As shown in FIG. 6, the read circuit 100 includes a discharge unit 110, a pre-charge unit 120, a read bias provision unit 130, a clamping unit 140, and a sense amp unit 150.

Before a read operation begins, the discharge unit 110 discharges a bit line (e.g., the bit line BL0) and/or a sensing node VSA, which is coupled to a selected memory cell MC, to a predetermined level, e.g., to the level of a ground voltage VSS. The discharge unit 110 may include NMOS transistors MN1 and MN2. The NMOS transistor MN1 is coupled between the bit lines BL0 and the ground voltage VSS and receives a discharge signal PDIS through a gate thereof. The NMOS transistor MN2 is coupled between the sensing node VSA and the ground voltage VSS and receives the discharge signal PDIS through a gate thereof.

The pre-charge unit 120 pre-charges the sensing node VSA to a predetermined level, e.g., to the level of a power supply voltage VCC during a pre-charge period of the data read operation. The pre-charge unit 120 may be a PMOS transistor MP1 which is coupled between the power supply voltage VCC and the sensing node VSA and receives the pre-charge signal PCHB through a gate thereof.

The read bias generation unit 130 supplies the read current Icell for test purposes to the sensing node VSA in response to the bias voltage VBIAS in order to read a resistance level of a selected resistive memory cell MC. When data stored in a resistive memory cell MC is set data, the resistance of the phase-change material is low. Thus, a large amount of current flows through the nonvolatile resistive memory cell MC. When the data stored in the resistive memory cell MC is reset data, the resistance of the phase-change material is high. Thus, a small amount of current flows through the resistive memory cell MC. Here, the amount of read current Icell for test purposes provided by the read bias provision unit 130 is only enough to compensate for current flowing through the resistive memory cell MC in a reset state. In this case, when the reset data is stored in the resistive memory cell MC, the level of the sensing node VSA is maintained or slightly rises. On the other hand, when the set data is stored in the resistive memory cell MC, the level of the sensing node VSA falls. Therefore, since the level of the sensing node VSA when the reset data is stored in the resistive memory cell MC is greatly different from that of the sensing node VSA when the set data is stored in the resistive memory cell MC, it is easy to distinguish the set data from the reset data. In this way, a sensing margin can be increased. The read bias provision unit 130 may include a PMOS transistor MP2 which is coupled between an operation voltage VPP and a node N0 and receives a select signal PBIASB through a gate thereof and a PMOS transistor MP3 which is coupled between the node N0 and the sensing node VSA and receives the bias voltage VBIAS through a gate thereof. Regions of a substrate on which the PMOS transistors MP2 and MP3 are formed may be coupled to the operation voltage VPP.

The clamping unit 140 clamps the bit line BL0 to a predetermined bias level, e.g., within a range appropriate for the read operation. Specifically, the clamping unit 140 clamps the bit line BL0 to a predetermined level equal to or lower than the level of a threshold voltage Vth of the phase-change material. This is because the bit line BL0 clamped to a level higher than the threshold voltage Vth can change the phase of the phase-change material of a selected resistive memory cell MC. The clamping unit 140 may be an NMOS transistor MN3 which is coupled between the bit line BL0 and the sensing node VSA and receives a clamping control signal VCMP through a gate thereof. The clamping control signal VCMP may be, but is not limited to, a constant voltage signal.

The sense amp unit 150 compares the level of the sensing node VSA with a reference level VREF and outputs a comparison result SA_OUT. When the level of the sensing node VSA is higher than the reference level VREF, the sense amp unit 150 may output the comparison result SA_OUT at a high level. When the level of the sensing node VSA is lower than the reference level VREF, the sense amp unit 150 may output the comparison result SA_OUT at a low level. When the comparison result SA_OUT is at a high level, data stored in a resistive memory cell MC is reset data. When the comparison result SA_OUT is at a low level, the data stored in the resistive memory cell MC is set data. The sense amp unit 150 may be a current sense amplifier that senses a change in electric current, which flows through the bit line BL0 coupled to a selected memory cell MC, with respect to a reference current. Alternatively, the sense amp unit 150 may be a voltage sense amplifier that senses a change in voltage with respect to a reference voltage. The sense amp unit 150 illustrated in FIG. 6 is a voltage sense amplifier.

Figure 7:
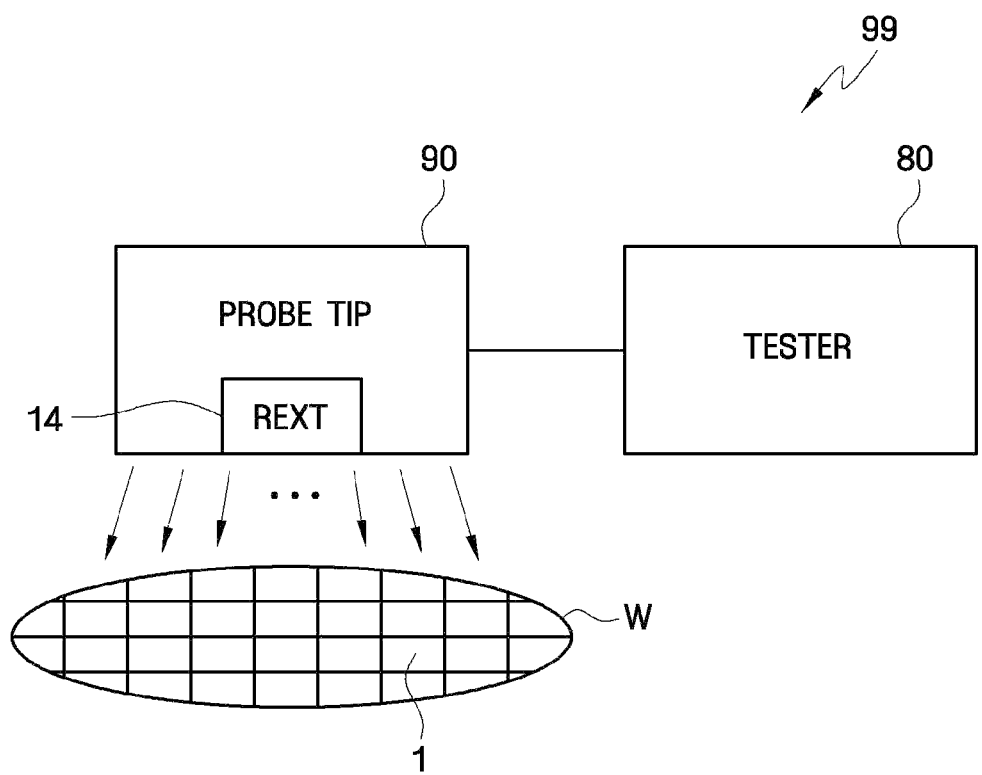
FIG. 7 is a system diagram illustrating use of a test apparatus according to an embodiment of the inventive concept.

FIG. 7 is a system diagram illustrating a test apparatus 99 according to certain embodiments of the inventive concept. As generally shown in FIG. 7, the test apparatus 99 comprises a tester 80, a probe tip 90 extending from the tester 80, and a plurality of semiconductor devices 1 (e.g., an array of wafer-stage semiconductor devices 1 being tested). For purposes of this example, it is assumed that each one of the plurality of semiconductor devices being tested by the system in FIG. 7 is similar to the semiconductor device 1 of FIG. 1. However, the plurality of semiconductor devise may be similar to any one of the semiconductor devices 2 through 6.

With these assumptions in place, the external impedance 14 is provide by the probe tip 90. The tester 80 is coupled to the probe tip 90 and applies an external voltage to the semiconductor devices 1 through the probe tip 90.

As described above, each of the semiconductor devices 1 may include a first pad to which an external voltage is applied, a second pad which is coupled to the external impedance 14, and a voltage-current converter which is coupled to the first pad and the second pad and generates a bias current using the external voltage and the external impedance 14.

As shown in FIG. 7, a current-related test may be conducted simultaneously across a large number of semiconductor devices 1 (e.g., more than 100 semiconductor devices) by applying the external voltage simultaneously to the respective semiconductor devices 1.

Figure 8:
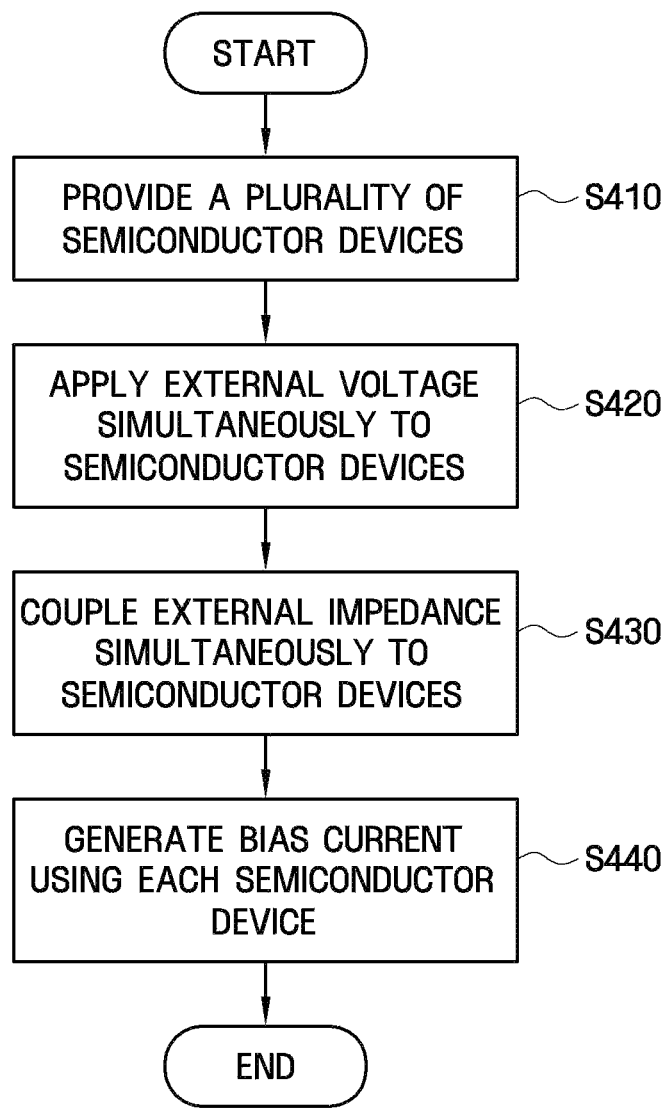
FIG. 8 is a flowchart summarizing one possible test method according to certain embodiments of the inventive concept.

FIG. 8 is a flowchart summarizing one possible test method according to an embodiment of the inventive concept.

Referring to FIG. 8, a plurality of semiconductor devices according to one or more embodiments of the inventive concept are provided and arranged for testing (S410). Each of the semiconductor devices may include a first pad to which an external voltage is applied, a second pad which is coupled to an external impedance during a test operation, and a voltage-current converter which is coupled to the first pad and the second pad and generates a bias current using the external voltage and the external impedance.

An external voltage is applied simultaneously to the first pads of the semiconductor devices (S420). The external impedance is coupled simultaneously to the second pads of the semiconductor devices (S430). Each of the semiconductor devices generates a bias current using the external voltage and the external impedance.

After the applying of the external voltage simultaneously to the first pads (S420), the coupling of the external impedance simultaneously to the second pads may be performed (S430). Conversely, after the coupling of the external impedance simultaneously to the second pads (S430), the applying of the external voltage simultaneously to the first pads (S420) may be performed. Alternatively, the applying of the external voltage (420) and the coupling of the external impedance (S430) may be performed simultaneously.

Regardless of relative order, once the external impedance is applied to the second pads (S430) and the external voltage is applied to the first pads (S420), a corresponding bias current is generated within each semiconductor device being tested (S440).

While the present inventive concept has been particularly shown and described with reference to exemplary embodiments thereof, it will be understood by those of ordinary skill in the art that various changes in form and detail may be made therein without departing from the scope of the following claims. The exemplary embodiments should be considered in a descriptive sense only and not for purposes of limitation.

What is claimed is:

1. A semiconductor device comprising:
a first pad that receives an external voltage during a test;
a second pad coupled to an external impedance during the test;
a voltage-current converter coupled to the first pad and the second pad and configured to generate a bias current substantially in response to only the external voltage and the external impedance; and
an internal circuit responsive to a test current during the test, wherein a level of the test current is defined by a level of the bias current,
wherein the voltage-current converter comprises:
a driving transistor coupled between a first voltage and the second pad and configured to generate the bias current in response to a bias voltage; and a comparator having inputs respectively coupled to the first pad and the second pad, having an output coupled to the gate of the driving transistor, and configured to generate the bias voltage at the output by comparing the external voltage with a reference voltage apparent at the second pad.

2. The semiconductor device of claim 1, wherein the external impedance is coupled between ground and the second pad during the test.

3. The semiconductor device of claim 2, wherein the semiconductor device is a semiconductor memory device including a sense amplifier and the first voltage is a step-up voltage used by the sense amplifier.

4. The semiconductor device of claim 1, wherein the external impedance is a resistance element temporarily coupled to the second pad during the test by an external test apparatus.

5. The semiconductor device of claim 4, wherein the external test apparatus is a probe tip.

6. The semiconductor device of claim 1, wherein the semiconductor device is a semiconductor memory device further comprising:
a resistive memory cell; and
a read circuit that generates a read bias in response to the bias voltage, and reads data stored in the resistive memory cell by providing the read bias to the resistive memory cell.

7. The semiconductor device of claim 1, further comprising:
a monitoring unit that generates a monitoring current mirroring the bias current.

8. A semiconductor device comprising:
a first pad that receives an external voltage during a test;
a second pad coupled to an external impedance during the test;
a voltage-current converter coupled to the first pad and the second pad and configured to generate a bias current substantially in response to only the external voltage and the external impedance;
an internal circuit responsive to a test current during the test, wherein a level of the test current is defined by a level of the bias current; and
a monitoring unit that generates a monitoring current mirroring the bias current,
wherein the voltage-current converter comprises a driving transistor coupled between a first voltage and the second pad and is configured to generate the bias current in response to a bias voltage, and
the monitoring unit comprises a third pad at which the monitoring current is apparent and a monitoring transistor coupled between a second voltage and the third pad and is configured to generate the monitoring current in response to the bias voltage.

9. A semiconductor device comprising:
a first pad that receives an external voltage during a test;
a second pad that is coupled to an external impedance during the test;
a voltage-current converter coupled to the first pad and the second pad and configured to generate a bias current substantially in response to only the external voltage and the external impedance; and
an internal circuit responsive to a test current during the test, wherein a level of the test current is defined by a level of the bias current,
wherein the voltage-current converter comprises:
a driving transistor coupled between ground and the second pad and configured to generate the bias current in response to a bias voltage; and a comparator having inputs respectively coupled to the first pad and the second pad, having an output coupled to the gate of the driving transistor, and configured to generate the bias voltage at the output by comparing the external voltage with a reference voltage apparent at the second pad.

10. The semiconductor device of claim 9, wherein the external impedance is coupled between a first voltage and the second pad during the test.

11. The semiconductor device of claim 10, wherein the semiconductor device is a semiconductor memory device including a sense amplifier and the first voltage is a step-up voltage used by the sense amplifier.

12. The semiconductor device of claim 9, wherein the external impedance is a resistance element temporarily coupled to the second pad during the test by an external test apparatus.

13. The semiconductor device of claim 12, wherein the external test apparatus is a probe tip.

* * * * *